United States Patent [19]

Brockmann

[11] Patent Number: 4,874,968
[45] Date of Patent: Oct. 17, 1989

[54] COMPONENT PRODUCED USING INTEGRATED TECHNOLOGY FOR THE FABRICATION OF INTEGRATED CIRCUITS

[75] Inventor: Werner Brockmann, Altenbeken, Fed. Rep. of Germany

[73] Assignee: Nixdorf Computer AG, Paderborn, Fed. Rep. of Germany

[21] Appl. No.: 128,392

[22] Filed: Dec. 3, 1987

[30] Foreign Application Priority Data

Dec. 4, 1986 [DE] Fed. Rep. of Germany ....... 3641452

[51] Int. Cl.$^4$ ...................... H03K 3/26; H03K 19/23; H03K 19/094
[52] U.S. Cl. .................................. 307/303; 307/465; 307/468; 340/825.83; 340/825.85; 340/825.91
[58] Field of Search ...................... 340/825.83, 825.85, 340/825.91; 307/465, 468, 443, 448, 303

[56] References Cited

U.S. PATENT DOCUMENTS 4,642,487  2/1987  Carter .................................. 307/468

*Primary Examiner*—John Zazworsky
*Assistant Examiner*—Margaret Rose Wambach

[57] ABSTRACT

For a component produced using integrated technology for providing integrated circuits with at least one programmable matrix shaped connecting field formed on a substrate with line and column conductors which can be connected in the area of at least one part of their intersecting points by coupling elements, two activatable or two deactivatable coupling elements (42,44) with a direction of activity at an angle of 90° to one another are assigned to each of at least one part of the intersection points within the connecting field.

10 Claims, 2 Drawing Sheets

COMPONENT PRODUCED USING INTEGRATED TECHNOLOGY FOR THE FABRICATION OF INTEGRATED CIRCUITS

FIELD OF THE INVENTION

The invention relates to a component manufactured using integrated technology to provide integrated circuits having at least one programmable matrix shaped connecting field with line and column conductors formed on a substrate and connected by coupling elements in the area of at least some of their respective intersection points.

DESCRIPTION OF THE PRIOR ART

Coupling elements in an activated state transfer the logical operating state of a conductor, possibly in an inverted state, to an intersecting conductor in such a form as to allow logical operations to be carried out on that operating state.

Components with connecting fields or logic-arrays for displaying logical circuits, and particularly those with programmable coupling elements, are available in a variety of forms. Programming can take place with the aid of masks when the component is being manufactured. After the component has been manufactured, programming, preferably by electrical means, can be done by means such as a laser beam, for example. The advantage of the connecting field's array structure is that within the fields, all conceivable Boolean operations can be carried out on the input values themselves and possibly, also with redirected signals. Programmability thus allows the integrated circuit to be adapted to a specific task after the integrated circuit has been manufactured (with electrical programming) or during manufacturing (with mask programming).

This allows the cost effective production of components in large quantities even if few integrated circuits are required per task. Adaptation of the circuit to a specific task is facilitated by means of a logical description provided by software tools.

The conversion of logical functions within an array-structure is effected by means of a combined arrangement of an AND- and an OR-array. WIRED-AND-, WIRED-OR, WIRED-NOR or WIRED-NAND- operations will preferably be used in the arrays, as these can be implemented through the use of, for example, bipolar transistors, field effect transistors or diodes as coupling elements in conjunction with so-called PULL-UP or PULL-DOWN elements, such as resistors. In this way, AND- or OR-functions can be represented by NAND- or NOR-functions due to the Boolean equivalence resulting from inversion.

Gate-arrays are also used for user specific integrated circuits. Prefabricated semi-conductor components have gates arranged in lines. The gates are only wired in a final metallization stage in accordance with the user required functions and are designated as gate-arrays. This approach allows the cost effective production of high quantities of like prefabricated semiconductor components. These components are only then customized in accordance with the specific requirements of the user.

Gate arrays are highly flexible but have high development costs, require complex development tools and long periods of time between the draft conclusion and delivery of the first prototype. Use of gate arrays can thus only be justified when a certain volume of the circuit to be implemented can be reached. Logic arrays are more favorable for certain operations due to their processing speed and the simplicity of the functional Specification. Their regular structure simplifies integration considerably.

A gap therefore exists between gate arrays and logic arrays since it is possible only to a limited degree to accommodate multi-stage logic circuits within a connecting field of the known type. As a rule, several connecting fields, possibly with additional active elements along the field's edges, are necessary in order to represent multi-stage or composite logic structures. An effort to maintain flexibility in allocation by, for example, providing as many different logical circuits as possible within a connecting field, can lead to a large demand for chip surface. This demand on the substrate surface has a considerable influence on the manufacturing costs of the circuit component. The structure of the chip is moreover more irregular and thus harder to test and integrate.

SUMMARY OF THE INVENTION

The object of the present invention is to specify a component of the previously mentioned type with a structure very regular in form and suitable for circuits of different types, complexity and size and which can be used regardless of the manufacturing process and type of customer information stored.

This object is achieved by a component of the above-mentioned type where within the connecting field, at least some of the intersection points each have associated with it two activatable or deactivatable coupling elements each connected between a line and a column conductor and crossing one another at the involved intersection point. At the intersection points, at which are located two such coupling elements, an operation can take place on both the vertical and horizontal conductors, so that the conductors in question can be used alternatively to implement an AND-function or an OR-function. This type of embodiment yields, for a very standard structured connecting field, an extraordinary flexibility with regard to the implementation and the type, scope and complexity of the circuits to be converted. This flexibility allows the circuits to be specified by means of software and easily integrated.

In a preferred embodiment of the invention, the line and column conductors each have at least one activatable or deactivatable interface, at which the respective conductor is divided into conductor segments. The possibility of dividing the conductors into segments allows optimum utilization of the connecting capability available in the connecting field, a high processing speed and the possibility of implementing logical functions at any position within the connecting field.

The variety of functions able to be implemented within the connecting field can be increased even further due to the fact that signal inverting connectors, hereafter referred to as inverting points, are allocated between segments of a conductor and/or intersecting conductors. These inverting points can be made activatable or deactivatable and/or unidirectional or bidirectional. At these inverting points, an operating state in the functional sense of a conductor or a conductor segment is transferred to another conductor or another conductor segment in a form such that the signal is inverted logically.

Another aspect of the present invention is that with the intersection points having two coupling elements each, the interfaces and the connectors are distributed homogeneously over the connecting field. Under certain conditions, i.e. with regard to certain functions to be implemented, it is also possible to provide all intersection points in certain areas of the connecting field with two coupling elements while providing only one coupling element per intersection point in other areas. Likewise for implementation of certain functions, providing more interfaces and/or inversion points in one part of the connecting field than in another may allow optimum use of the available connecting field possibilities, and also serve to keep as low as possible, the overheads such as circuit parts only required for programming and testing the circuits.

DESCRIPTION OF THE PREFERRED EMBODIMENT

Circuit parts used for activating/deactivating or for programming the connecting field or its elements are not shown. They are not the subject of this invention and are known to one skilled in the art. A detailed display of activated or deactivated elements are omitted. The figures can thus be taken as schematic representations.

Figure 1:
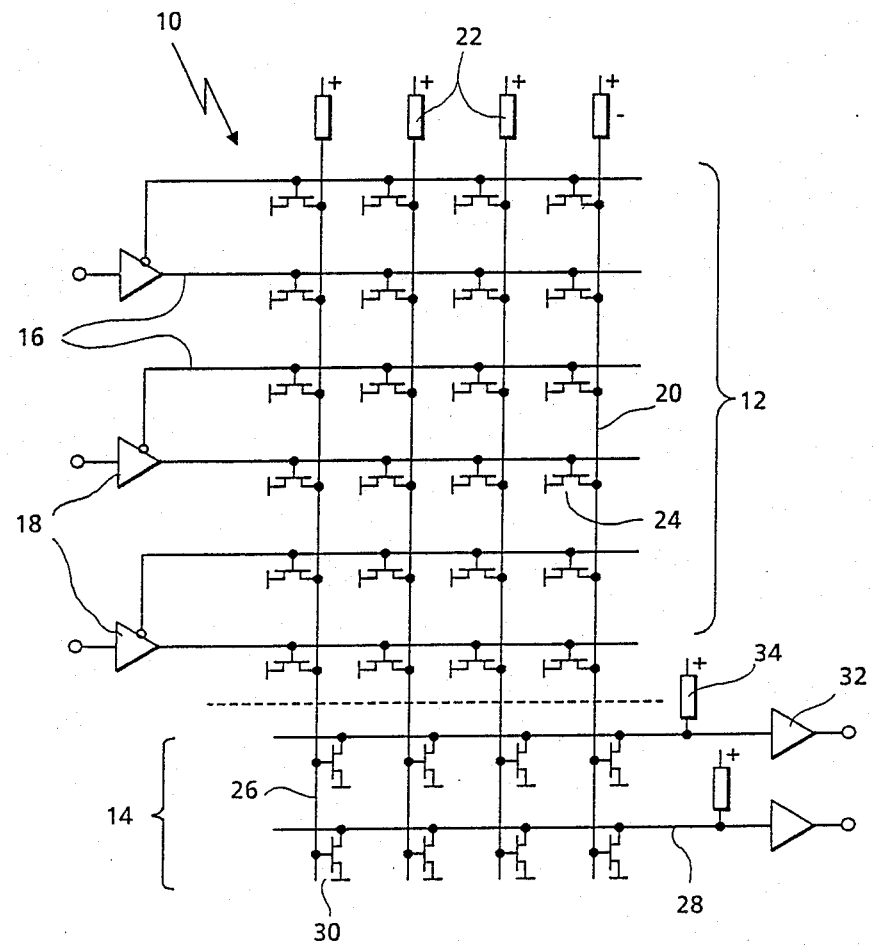
FIG. 1 is a diagram of a traditional logic-array with WIRED-NOR-function.

FIG. 1 shows a connecting field, marked generally as 10, consisting of an AND-array 12 and an OR-array 14. The AND-array 12 comprises horizontal or line conductors 16 which are connected by pairs to the non-inverting and inverting output of an input driver 18, as well as to vertical or column conductors 20. The upper ends of the column conductors 20 are connected to the resistors 22 which act as PULL-UP-elements.

In the embodiment shown, a coupling element 24 is at each intersection point between the line conductors 16 and the column conductors 20. Coupling elements 24 could be transistors having their gate electrode connected to the associated line conductor by means of an activation device. A signal occurring at a line conductor 16 enables conductively the transistors connected to that line 16, so that the voltage drops on the column conductors 20 connected to the enabled transistors. It can be seen from this example that at the lower end of the column conductor 20, a positive voltage signal is only present if there is no positive signal available on any of the line conductors 16 connected to the respective column conductors with an activated coupling element 24. Through suitable programming, i.e. by activation/deactivation of certain coupling elements 24, definable operations can be generated on the column conductors 20. The operations in this case are WIRED-NOR operations of the line conductor signals of activated coupling elements.

The OR-array 14 is comprised of the line conductors 28 and the column conductors 26 that connect directly to the column conductors 20 of the AND-array 12. At the intersection points between column conductors 26 and line conductors 28 are coupling elements 30, which are at an angle of 90° to the coupling elements 24 of the AND-array 12. The line conductors 28 of the OR-array 14 are connected to output drivers 32 and pull-up elements such as resistors 34. The signals output at the column conductors 20 of the AND-array 12 also connect to the line conductors 28 of the OR-array 14 in a manner established by programming, i.e. activating-/deactivating the coupling elements 30. A WIRED-NOR-operation is also executed here though using more complex signals. On the whole, this two-stage NOR-NOR-operation is equivalent to an AND-OR-operation as seen from the following example implementing a function by use of this equivalence:

$$\overline{\overline{(A + B)} + \overline{(A + C)}} = \overline{(A \cdot B) + (A \cdot C)}$$

Appropriate association of the output ports of the input drivers 18 and the inverting output drivers 32 guarantees equivalence to an AND-OR-operation. The traditional connecting field 10 therefore comprises two differently structured areas 12 and 14 by which any operations on the input signals can be represent for each output by means of suitable activation/deactivation of the coupling elements 24 or 30.

As the number of inputs and field size increases, few of these inputs must be connected in an intensive manner within groups, at the same time there only being a comparatively loose coupling between these groups. The conventional structure of FIG. 1 is extremely ineffective at implementing these connections since the connections must either be expanded due to the two stage structure or certain areas within the connecting field cannot be used. All elements not required to implement these functions are thus not used and are given away in principle. These redundancies increase the run times on the chip by requiring an unnecessary number of long conductor paths or connections to display the logic functions, and also cause unnecessary cost due to the resulting unnecessary size of the connecting field.

Figure 2:
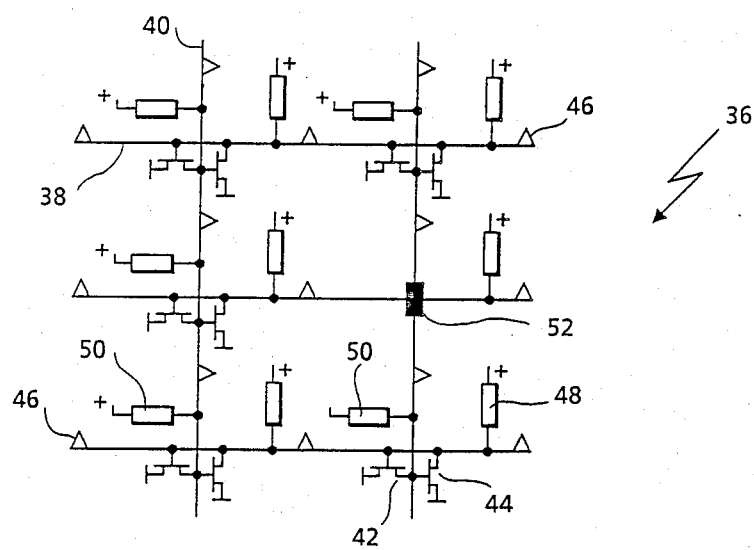
FIG. 2 is a cross section of a connecting field according to this invention with WIRED-NOR-function.

In contrast to the two part structure of the connecting field 10 of FIG. 1, the connecting field 36 according to the present invention displayed in FIG. 2, has a standard structure over its entire surface. The line conductors 38 and the column conductors 40 of the connecting field 36 are connected at their intersection points by means of two coupling elements 42 or 44 with a direction of activity at an angle of 90° to one another. Whether coupling at each intersection point should be in a vertical direction (i.e. an AND operation) or a horizontal direction (i.e. OR operation) can thus be decided by activation or deactivation of one of the two coupling elements 42 or 44 at that intersection point. Activation or deactivation of the coupling elements 42, 44 can still take place in the traditional sense. In the connecting field 36 the division into two subfields of different functions is thus abolished.

Bidirectional interfaces 46 lie between every two intersection points on the line conductors 38 and the column conductors 40 and allow the conductors 38,40 to be preferably programmably interrupted. Each of the conductor segments set up or generated in this way is connected to a resistor 48 or 50 which acts as a PULL-UP-element.

A connector 52 is formed at an intersection point of the connecting field 36. At this connector 52, the operating state of a conductor or conductor segment can be transferred to the intersecting conductor or conductor segment preferably in such a way that a logical inversion of signals takes place. Of course several inversion points 52 may be distributed over the connecting field 36.

From the arrangement described thus far in accordance with FIG. 2, a normal logic-array-structure of variable size and location may be made whereby only the corresponding coupling element 42 or 44 of an active intersection point is activated, and appropriate use is made of the interrupt facility provided by the interfaces 46, i.e. line multiplexing. The arrangement in FIG. 2, however, also allows the formation of elements which could not be displayed with a traditional logic-array. An intersection point can therefore for example, represent an RS-flip-flop if both coupling elements 42 and 44 are activated. Splitting conductors 38 and 40 into segments with interfaces 46 allows not only gates of any size, function (AND, NOR, OR) and location, but also more complex designs such as flip-flops, half-adders or multiplexers, etc. Using the interfaces 46 in such a fashion can also provide wiring to pass on a signal within the array. In this way, circuit parts having an irregular structure, and in particular, multi-stage logic, can be implemented within the regularly shaped connecting field. In addition, a multi-stage logic structure of traditional connecting fields may be formed within a connecting field with comparatively few interfaces 46. This facilitates a more effective utilization of the connecting field than in the traditional means, and allows more complex logic to be implemented.

The main function of connectors 52 is to logically invert signals. In the example of FIG. 2, this is advantageously done by means of a direct (metal) connection, since the transitions through coupling elements 42 or 44 are inverted, with the result that a logical inversion ensues from a direct transition. This transfer is bidirectional. Possible disadvantages can be avoided due to the interfaces 46 in the vicinity. On the other hand, drivers can also be used which operate in a unidirectional and signal-regenerating mode.

The problem of long run times which arises in MOS-technologies due to load capacitance can be resolved in two ways using the connecting field according to the present invention. First, the regenerating effect of the coupling elements is utilized by alternating from one conductor segment to a conductor segment running in the same direction. Second, conductors connected with comparatively few coupling elements can be inserted into the connecting field so that parasitical capacities are kept low.

Figure 3:
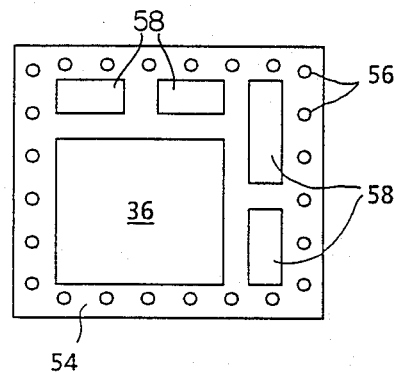
FIG. 3 is a top view of an integrated circuit according to this invention with additional circuit parts.

In the case of user specific integrated circuits there are many cases where certain complex functions, such as Arithmetic Logic Units, RAMs, ROMs, multipliers, etc. must be surrounded by specific circuits. In order to minimize the number of connection pins, the circuit-overheads (i.e. the circuit parts which are only required for programming or testing the integrated circuits) and the delay times, all functions should be kept on one substrate, as shown in FIG. 3. The connection pins 56 are arranged along the edges of the substrate 54. Several circuit blocks 58 are also placed apart from the connecting field 36 on the substrate. This arrangement consists therefore of fixed, wired, functionally determined logic elements preferably with complex functionality. In this example, the connecting field 36 can be used to wire the blocks 58 for specific applications and thereby additionally carry out more operations and/or to control them. On the other hand, one or more of the blocks 58 can be used to supported the functions of the connecting field 36.

Depending on the production or programming procedure, there are ways according to the present invention, to adapt the structure to meet requirements. With mask-programming where the customizing wiring mask(s) is (are) produced individually for each respective task, it is not absolutely necessary to produce interfaces and conductor paths for a few connected coupling elements. A programing overhead is not essential. For electrical programming that ensues when the component is manufactured completely (melting of fuse links, EPROM-, EEPROM-, RAM-procedures and the like), a large number of elements generally remain unused. The connecting field according to the present invention offers the opportunity of free allocation of logical functions. In this way the connecting field is well utilized.

In general, digital logic integrated in an IC can be divided into certain functional groups. These could be, for example, AND-operations (decoder) of input signals, more complex operations of this term (e.g. storage) and output signals based on OR-operations. Therefore, by proceeding in a suitable manner the homogeneity and flexibility of the connecting field can be reduced without losses to functionality. The programming overhead results from the need to be able to address each programming point (maximum 4 per intersection point) individually from the outside. A voltage multiplexer could possibly be used to reduce the programming overhead.

The homogeneity and flexibility of the connecting field is reduced, for example, by placing only one coupling element at intersection points and not providing an interface between every two intersection points. The individual coupling elements can then be arranged in different areas with different directions of activity. Various combinations are therefore possible, where, for example, AND-functions are provided predominantly in the area of external inputs, OR-functions predominantly in the area of internal output and any other functions such as registers, in between. This can be seen for example in the following connecting field structure where a first area formed on the input side of the connecting field has intersection points supplied predominantly with only one AND-function coupling element and has few interfaces but many inversion points. A second area near the middle of the connecting field has intersection points with two coupling elements each allowing interfaces to be provided between nearly all such intersection points that could be for example, memory elements. A third area setup on the output side has intersection points suppled predominantly with only one OR-function coupling element, and has few interfaces and only some inversion points.

This example portrays only one design possibility for the connecting field according to the present invention. According to the invention, other combinations of differently structured connecting fields formed on a substrate are possible. Of course, these connecting fields could also be arranged on a substrate with the conventional connection fields.

Due to the inversion points provided within the connecting field it is not essential to supply the connecting field with input signals in both an inverted and non-inverted form. This leads to a saving on conductor and conductor segments in general (see FIG. 1).

The position of inversion points and interfaces within the connecting field depends on, amongst other things, the type of logic to be converted. For bus-oriented logic (data processing), parallel arrangements with regular structures are preferred. For Random-Logic (circuit parts with irregular structure) many interfaces and coupling elements with different orientations are preferred.

A connecting field in accordance with the present invention allows user-specific integrated circuits to be produced that cover the entire marketplace spectrum. The spectrum ranges from simple user-programmable circuits to complex structures whose limits are determined only by technical feasibility. A particular advantage of this invention is that the same development software can be used for all user requirement. In this way macro-elements can also be defined and introduced, the type of circuit to be converted therefore only playing a subordinate role. Moreover, it is also possible to use user-programmable circuits as prototypes for mask programmed circuit or for evaluation. Mask programmed circuits are only worthwhile in large quantities and are compulsory for very complex structures. The technique used to fabricate the circuits plays as minor a role as the question whether the circuits should be operated dynamically or statically.

I claim:

1. An integrated circuit component with at least one programmable matrix type connecting field formed on a substrate and having line and column conductors forming a plurality of intersection points, and
   at least some of said intersection points each having associated with it two coupling elements each connected between and associated with the line and column conductor crossing one another at the involved intersection point,
   each of said two coupling elements associated with an intersection point having an initial active or inactive state and being capable of being deactivated or activated to give it a state opposite to that of its initial state,
   one of said coupling elements when active serving to connect the associated line conductor to another terminal in response to signals on the associated column conductor and the other of said coupling elements when active serving to connect the associated column conductor to another terminal in response to signals on the associated line conductor.

2. An integrated circuit component as defined in claim 1 further characterized by each of said line conductors and each of said column conductors having at least one interface at which the associated conductor can be divided into conductor segments,
   each of said interfaces having an initial active or inactive state and being capable of being deactivated or activated to give it a state opposite to that of its initial state,
   each of said interfaces having associated with it two segments of the associated conductor and serving in its active state to electrically connect said two associated conductor segments and serving in its inactive state to electrically disconnect said two associated conductor segments.

3. An integrated circuit component as defined in claim 1 further characterized by at least some other said intersection points each having associated with it a logically non-inverting connector between the line and column conductor crossing one another at the involved intersection point.

4. An integrated circuit component as defined in claim 1 further characterized by at least some other said intersection points each having associated with it a logically inverting connector between the line and column conductor crossing one another at the involved intersection point.

5. An integrated circuit component as defined in claim 4 further characterized by each of said connectors being bidirectional.

6. An integrated circuit component as defined in claim 3 further characterized by each of said connectors having an initial active or inactive state and being capable of being deactivated or activated to give it a state opposite to that of its initial state.

7. An integrated circuit component as defined in claim 4 further characterized by each of said connectors having an initial active or inactive state and being capable of being deactivated or activated to give it a state opposite to that of its initial state.

8. An integrated circuit component as defined in claim 2 further characterized by other of said intersection points each having associated with it a logical connector for transferring a logic signal in either inverted or noninverted form from one to the other of the conductors comprising the involved intersection point.

9. An integrated circuit component as defined in claim 8 further characterized by said intersection points having two coupling elements, said intersection points having connectors and said interfaces being distributed uniformly over said connecting field.

10. An integrated circuit component as defined in claim 1 wherein along the borders of said connecting field there are active elements with extended logical functions.

* * * * *